United States Patent [19]
Kashiwagi et al.

[11] Patent Number: 5,759,221
[45] Date of Patent: Jun. 2, 1998

[54] METHOD OF PRESS MOLDING GLASS OPTICAL ELEMENTS

[75] Inventors: Yoshinari Kashiwagi, Neyagawa; Makoto Umetani, Izumi; Hidenao Kataoka, Hirakata; Kenji Inoue, Nishinomiya; Shoji Nakamura, Hirakata; Satoru Morimoto, Tondabayashi, all of Japan

[73] Assignee: Matsushita Electric Industrial Co., Ltd., Osaka, Japan

[21] Appl. No.: 847,987

[22] Filed: Apr. 21, 1997

Related U.S. Application Data

[62] Division of Ser. No. 623,889, Mar. 29, 1996, which is a division of Ser. No. 281,690, Jul. 28, 1994.

[30] Foreign Application Priority Data

| Jul. 28, 1993 | [JP] | Japan | 5-186047 |
| Nov. 4, 1993 | [JP] | Japan | 5-275623 |
| Dec. 16, 1993 | [JP] | Japan | 5-316188 |
| Jun. 2, 1994 | [JP] | Japan | 6-121207 |

[51] Int. Cl.⁶ .................................................... C03B 11/08
[52] U.S. Cl. ........................ 65/102; 65/64; 65/26; 264/1.1; 264/1.32
[58] Field of Search ............................ 65/102, 111, 64, 65/26, 286, 305, 374.1, 374.11, 374.12, 374.13; 249/116, 135; 425/808; 264/1.1, 1.31, 1.32, 2.7

[56] References Cited

U.S. PATENT DOCUMENTS

| 4,251,254 | 2/1981 | Klomp et al. | 65/374.13 |
| 4,391,622 | 7/1983 | Alting et al. | |
| 4,685,948 | 8/1987 | Kuribayashi et al. | |
| 4,721,518 | 1/1988 | Monji et al. | |
| 4,921,519 | 5/1990 | Schinker et al. | |
| 5,026,415 | 6/1991 | Yamamoto et al. | 65/374.13 |
| 5,171,348 | 12/1992 | Umetani et al. | |
| 5,380,349 | 1/1995 | Taniguchi et al. | 65/286 |

FOREIGN PATENT DOCUMENTS

| 0191618 | 8/1986 | European Pat. Off. . |
| 0404481 | 12/1990 | European Pat. Off. . |
| 0567896 | 11/1993 | European Pat. Off. . |
| 60-264330 | 12/1985 | Japan . |
| 62-3031 | 1/1987 | Japan . |
| 1-111737 | 4/1989 | Japan ................ 65/374.11 |
| 1-111738 | 4/1989 | Japan ................ 65/374.11 |
| 2-83221 | 3/1990 | Japan . |
| 03050127 | 5/1991 | Japan . |
| 3-146428 | 6/1991 | Japan ................ 65/374.11 |
| 4-154634 | 5/1992 | Japan . |
| 4-338121 | 11/1992 | Japan ................. 65/374.1 |
| 2242426 | 10/1991 | United Kingdom ... 65/374.1 |

*Primary Examiner*—Steven P. Griffin
*Attorney, Agent, or Firm*—Morrison & Foerster LLP

[57] ABSTRACT

A method of press-molding glass optical elements by press-molding glass, having a high melting point, at a temperature of 650° C. and higher using a die for press-molding glass optical elements which includes a base material having a heat resistance and sufficient strength to withstand press-molding of optical glass elements, a cutting layer on the base material, and a surface protective layer on the cutting layer. The cutting layer is formed of an alloy film containing P and one metal selected from the group Ni, Co, and Fe, and one metal from the group Si, Ti, Cu, Zr, Nb, Mo, Ru, Rh, Pd, Hf, Ta, W, Re, Os, and Ir, or an alloy film containing Cu and 20 to 80 atom % of one metal selected from the group Ni, Co, Fe, Si, Ti, Zr, Nb, Mo, Ru, Rh, Pd, Hf, Ta, W, Re, Os, and Ir, or an alloy film containing Si and 20 to 80 atom % of one metal selected from the group Ni, Co, Fe, Cu, Ti, Zr, Nb, Mo, Ru, Rh, Pd, Hf, Ta, W, Re, Os, and Ir. The surface protective layer is formed of an alloy film of at least one metal selected from the group Pt, Pd, Ir, Rh, Os, Ru, Re, W, and Ta.

6 Claims, 4 Drawing Sheets

METHOD OF PRESS MOLDING GLASS OPTICAL ELEMENTS

This application is a division of application Ser. No. 08/623,889, filed Mar. 29, 1996, which is a division of application Ser. No. 08/281,690, filed Jul. 28, 1994, both pending.

FIELD OF INVENTION

This invention relates to glass optical elements, and in particular, to a method for press-molding glass optical elements having high surface accuracy. This invention also relates to a die used for the press-molding process, and to a method of manufacturing the die.

BACKGROUND OF THE INVENTION

In order to press-mold glass optical elements having high accuracy repeatedly by means of a die, it is necessary to use a die material which is stable at high temperatures, has excellent resistance to oxidation, and is inert with respect to glass. In addition, the material must have excellent mechanical strength so that the surface accuracy is maintained when pressed. On the other hand, the material must have excellent machinability so as to be machined precisely and easily.

It is disclosed that die materials which meet these requirements to some degree are a mixed material consisting of titanium carbide (TiC) and metal (Laid-open Japanese patent application No. (Tokkai Sho) 59-121126) or a material comprising a base material of cemented carbide on which a precious metal film is formed (Laid-open Japanese patent application No.(Tokkai Sho) 62-96331).

However, the conventional materials of the die do not meet the above-mentioned requirements completely. For example, the material of the die using a mixed material of TiC and metal has excellent mechanical strength, but is poor in machinability due to its extreme hardness. Thus, it is difficult to machine with high accuracy. In addition, this material has a further defect in that it easily reacts to lead (Pb) or an alkaline element contained in glass optical elements When a material comprises a base material of cemented carbide on which a precious metal film is formed, a diamond wheel is used to machine the cemented carbide. At this time, it is difficult to form a fine shape due to wear of the diamond wheel. Therefore, a special processing device is needed. Furthermore, there are problems that the process take a long time and that the die is extremely expensive.

A further problem is that a diamond tool used for cutting the hard base material is worn down during the process. Therefore, it is impossible to proceed with the cutting, and a shape having a small radius of curvature which can not be attained by a grinding process can not be fabricated.

The following method of manufacturing a die has proposed a solution to the above-noted problems (Laid-open Japanese patent application No.(Tokkai Sho) 62-3031). A base material used here has excellent heat resistance, heat shock resistance, and strength at high temperatures. A fine cutting layer comprising a material which can be ground and cut excellently and is chemically stable and having a high melting point, for example, Pt-alloy film, is formed on the base material. After this layer is formed into a desired surface through a fine machining process, the mold surface is coated with a Pt-alloy film for protection.

Another method of manufacturing a die is disclosed in Laid-open Japanese patent application No.(Tokkai Hei) 3-23230. In this instance, a film formed on a base material of cemented carbide has good adhesion to the base material. On top of this, an electroless Ni-P plated film, for example, is formed as a fine cutting layer. After this layer is cut precisely into a desired surface, the mold surface is coated with an alloy film for protection.

However, using the above-noted manufacturing methods, the film formed as a cutting layer did not have sufficient strength so that the die was deformed when press-molded. Therefore, it was actually impossible to mold at high temperatures of 650° C. and higher.

SUMMARY OF THE INVENTION

It is an object of this invention to solve the above-noted problems by providing a die for press-molding glass optical elements having high melting points and various shapes repeatedly. This was not possible with conventional grinding methods.

In order to accomplish these and other objects and advantages, a die for press-molding glass optical elements in the invention comprises a base material having heat resistance and sufficient strength to withstand the press-molding process of glass optical elements, and a cutting layer formed on said base material comprising at least one film selected from the group consisting of an alloy film containing phosphorus (P), an alloy film containing boron (B), an alloy film containing copper (Cu), an alloy film containing silicon (Si), and an amorphous film. The cutting layer is covered with an alloy film which includes at least one metal selected from the group consisting of Pt, palladium (Pd), iridium (Ir), rhodium (Rh), osmium (Os), ruthenium (Ru), rhenium (Re), tungsten (W), and tantalum (Ta).

It is preferable in this embodiment that an intermediate layer comprising at least one film selected from the group consisting of metal, carbide, nitrogen, and oxide is present between the base material and the cutting layer.

Furthermore, it is preferable in this embodiment that when the alloy film containing P is present, the alloy film also contains one metal selected from the group consisting of Ni, Co, and Fe, and further contains one metal selected from the group consisting of Si, titanium (Ti), Cu, zirconium (Zr), niobium (Nb), molybdenum (Mo), Ru, Rh, Pd, hafnium (Hf), Ta, W, Re, Os, and Ir.

Furthermore, it is preferable in this embodiment that when the alloy film containing B is present, the alloy film also contains one metal selected from the group consisting of Ni, Co, and Fe, and further contains one metal selected from the group consisting of Si, Ti, Cu, Zr, Nb, Mo, Ru, Rh, Pd, Hf, Ta, W, Re, Os, and Ir.

Furthermore, it is preferable in this embodiment that the alloy film containing Cu be a Cu-alloy film containing 20 to 80% by atom (hereinafter abbreviated as at %) of one metal selected from the group consisting of Ni, Co, Fe, Si, Ti, Zr, Nb, Mo, Ru, Rh, Pd, Hf, Ta, W, Re, Os, and Ir.

Furthermore, it is preferable in this embodiment that the alloy film containing Si be a Si-alloy film containing 20 to 80 at % of one metal selected from the group consisting of Ni, Co, Fe, Cu, Ti, Zr, Nb, Mo, Ru, Rh, Pd, Hf, Ta, W, Re, Os, and Ir.

It is preferable in this embodiment that when the amorphous film is present, it comprises at least one metal selected from or one alloy consisting of the group consisting of Ni, Co, Cr, Ta, Mo, Ti, W, Nb, vanadium (V), Cu, and aluminum (Al).

The method of manufacturing a die for press-molding in a second embodiment of this invention comprises forming a base material having heat resistance and sufficient strength to withstand the press-molding process of glass optical elements into a shape similar to a desired shape of the die, forming a cutting layer on said base material comprising at least one film selected from the group consisting of an alloy film containing P, an alloy film containing B, an alloy film containing Cu, an alloy film containing Si, and an amorphous film by means of at least one method selected from the group consisting of a plating method, an evaporation method, a sputtering method, and an ion plating method, and covering the cutting layer with an alloy film which includes at least one metal selected from the group consisting of Pt, Pd, Ir, Rh, Os, Ru, Re, W, and Ta.

It is preferable that this embodiment further comprises forming an intermediate layer comprising at least one film selected from the group consisting of metal, carbide, nitrogen, and oxide between the base material and the cutting layer by means of at least one method selected from the group consisting of a plating method, an evaporation method, a sputtering method, an ion plating method, and a chemical vapor deposition (CVD) method.

Furthermore, it is preferable in this embodiment that when the alloy film containing P is present, the film further comprises one metal selected from the group consisting of Ni, Co, and Fe, and one metal selected from the group consisting of Si, Ti, Cu, Zr, Nb, Mo, Ru, Rh, Pd, Hf, Ta, W, Re, Os, and Ir.

Furthermore, it is preferable in this embodiment that when the alloy film containing B is present, the film further comprises a metal selected from the group consisting of Ni, Co, and Fe, and also comprises one metal selected from the group consisting of Si, Ti, Cu, Zr, Nb, Mo, Ru, Rh, Pd, Hf, Ta, W, Re, Os, and Ir.

Furthermore, it is preferable in this embodiment that when the alloy film containing Cu is present, it is a Cu-alloy film containing 20 to 80 at % of a metal selected from the group consisting of Ni, Co, Fe, Si, Ti, Zr, Nb, Mo, Ru, Rh, Pd, Hf, Ta, W, Re, Os, and Ir.

Furthermore, it is preferable in this embodiment that when the alloy film containing Si is present, it is a Si-alloy film containing 20 to 80 at % of a metal selected from the group consisting of Ni, Co, Fe, Cu, Ti, Zr, Nb, Mo, Ru, Rh, Pd, Hf, Ta, W, Re, Os, and Ir.

Furthermore, it is preferable in this embodiment that when the amorphous film is present, it is at least one metal selected from or one alloy consisting of the group consisting of Ni, Co, Cr, Ta, Mo, Ti, W, Nb, V, Cu, and Al.

A method of press-molding glass optical elements with a die in a third embodiment of the invention comprises press-molding glass having a high melting point at a temperature of 650° C. and higher by using a die for press-molding glass optical elements which comprises a base material having heat resistance and sufficient strength to withstand the press-molding process of glass optical elements, a cutting layer on said base material comprising at least one film selected from the group consisting of an alloy film containing P, an alloy film containing B, an alloy film containing Cu, an alloy film containing Si, and an amorphous film, wherein the cutting layer is covered with an alloy film which includes at least one metal selected from the group consisting of Pt, Pd, Ir, Rh, Os, Ru, Re, W, and Ta.

It is preferable in this embodiment that when the alloy film containing P is present, it also comprises a metal selected from the group consisting of Ni, Co, and Fe, and further comprises a metal selected from the group consisting of Si, Ti, Cu, Zr, Nb, Mo, Ru, Rh, Pd, Hf, Ta, W, Re, Os, and Ir.

Furthermore, it is preferable in this embodiment that when the alloy film containing B is present, it also comprises a metal selected from the group consisting of Ni, Co, and Fe, and further comprises one metal selected from the group consisting of Si, Ti, Cu, Zr, Nb, Mo, Ru, Rh, Pd, Hf, Ta, W, Re, Os, and Ir.

Furthermore, it is preferable in this embodiment that the alloy film containing Cu is a Cu-alloy film containing 20 to 80 at % of a metal selected from the group consisting of Ni, Co, Fe, Si, Ti, Zr, Nb, Mo, Ru, Rh, Pd, Hf, Ta, W, Re, Os, and Ir.

Furthermore, it is preferable in this embodiment that the alloy film containing Si is a Si-alloy film containing 20 to 80 at % of a metal selected from the group consisting of Ni, Co, Fe, Cu, Ti, Zr, Nb, Mo, Ru, Rh, Pd, Hf, Ta, W, Re, Os, and Ir.

Furthermore, it is preferable in this embodiment that the amorphous film is at least one metal selected from or one alloy consisting of from the group consisting of Ni, Co, Cr, Ta, Mo, Ti, W, Nb, V, Cu, and Al.

In particular, this die comprises a base material having heat resistance and sufficient strength to withstand a press-molding process for optical glass, and a cutting layer formed on said base material comprising a ternary alloy film consisting of one metal selected from the group consisting of Ni, Co, and Fe, one metal selected from the group consisting of Si, Ti, Cu, Zr, Nb, Mo, Ru, Rh, Pd, Hf, Ta, W, Re, Os, and Ir, and one element selected from the group consisting of P and B, or a Cu-alloy film containing 20 to 80 at % of one metal selected from the group consisting of Ni, Co, Fe, Si, Ti, Zr, Nb, Mo, Ru, Rh, Pb, Hf, Ta, W, Re, Os, and Ir, or a Si-alloy film containing 20 to 80 at % of one metal selected from the group consisting of Cu, Ni, Co, Fe, Ti, Zr, Nb, Mo, Ru, Rh, Pb, Hf, Ta, W, Re, Os, and Ir, or an amorphous film comprising at least one metal selected from the group consisting of Ni, Co, Cr, Ta, Mo, Ti, W, Nb, V, Cu, and Al. After this cutting layer is cut with high surface accuracy, an alloy film containing at least one metal selected from the group consisting of Pt, Pd, Ir, Rh, Os, Ru, Re, W, and Ta is formed as a protective film on the cutting layer. In this way, a die is provided which can be used to press-mold glass optical elements having high melting points and various shapes. By press-molding an optical glass having a high melting point at the temperature of 65020 C. and higher repeatedly, a large quantity of glass optical elements having high melting points and various shapes at a low cost can be produced which was impossible using conventional methods.

Furthermore, by forming an intermediate layer between the base material and the cutting layer comprising at least one film made from a material selected from the group consisting of metal, carbide, nitrogen, and oxide, it is possible to prevent the cutting layer from peeling, and it improves the durability of the die.

A die for press-molding glass optical elements which is manufactured according to the above-noted method, has sufficient strength to withstand the press-molding process by using a base material having excellent heat resistance and strength. This invention enables the die to be cut into a desired shape easily with high accuracy by forming a cutting layer which comprises a ternary alloy film comprising a metal selected from the group consisting of Ni, Co, and Fe, one metal selected from the group consisting of Si, Ti, Cu, Zr, Nb, Mo, Ru, Rh, Pd, Hf, Ta, W, Re, Os, and Ir, and one element selected from the group consisting of P and B, or a Cu-alloy film containing 20 to 80 at % of a metal selected from the group consisting of Ni, Co, Fe, Si, Ti, Zr, Nb, Mo, Ru, Rh, Pb, Hf, Ta, W, Re, Os, and Ir, or a Si-alloy film containing 20 to 80 at % of one metal selected from the group consisting of Cu, Ni, Co, Fe, Ti, Zr, Nb, Mo, Ru, Rh, Pb, Hf, Ta, W, Re, Os, and Ir, or an amorphous film comprising at least one metal selected from the group consisting of Ni, Co, Cr, Ta, Mo, Ti, W, Nb, V, Cu, and Al. In addition, this die also attains the heat resistance and the strength at high temperatures which can stand the press-molding process of glass having a high melting point at a temperature of 650° C. and higher.

The die also prevents itself from welding with the glass by forming an alloy film containing at least one metal selected from the group consisting of Pt, Pd, Ir, Rh, Os, Ru, Re, W, and Ta as a surface protective film.

As a result, this invention enables production of a press-molding die for glass having a high melting point and various shapes. By press-molding the glass using the die of this invention, it enables production of a large quantity of glass optical elements having high melting points and various shapes at a low cost which was impossible by the conventional grinding process. Furthermore, by forming an intermediate layer comprising at least one film made of a material selected from the group consisting of metal, carbide, nitrogen, and oxide, the adhesive strength between the base material and the cutting layer improves, and this prevents the film from peeling. Thus, it enables improved durability of the die.

DETAILED DESCRIPTION OF THE INVENTION

This invention is specifically described by referring to the following illustrative examples and attached figures.

EXAMPLE 1

Figure 1:
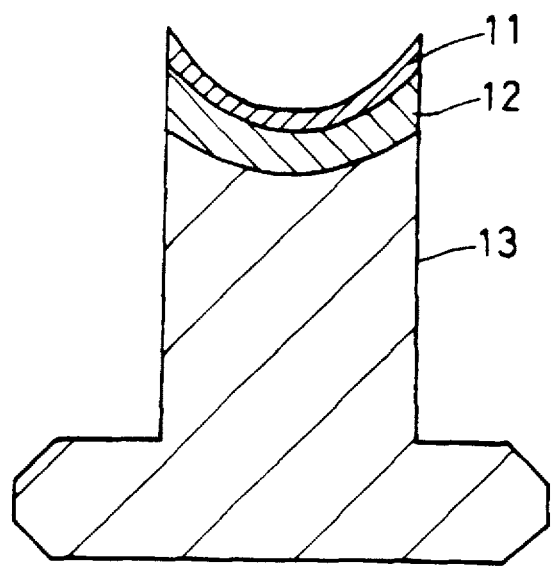
FIG. 1 is a cross-sectional view of one embodiment of this invention showing a die for press-molding glass optical elements.

A molding die of this embodiment is shown in FIG. 1. As shown in FIG. 1, the molding die of this embodiment comprises a base material of cemented carbide 13 on top of which a cutting layer 12 is formed into a desired shape with high accuracy. Furthermore, a Pt-Ir alloy protective layer 11 is formed on cutting layer 12 for protection.

A manufacturing method of the molding die shown in FIG. 1 is described as follows.

First of all, base material of cemented carbide 13 is processed into the shape similar to the desired shape by means of electrical discharge machining.

Then, cutting layer 12 is formed by a sputtering method on top of the base material 13 which is roughly processed by the electrical discharge machining.

After that, the cutting layer 12 is cut using a diamond tool, forming the cutting layer 12 into a desired shape with high accuracy.

When this method is explained in detail by providing specific values, base material of cemented carbide 13 is a cemented carbide material mainly comprising tungsten carbide (WC) of 6 mm diameter and 10 mm thickness which is roughly processed by electrical discharge machining into upper and lower dies having hollow-shaped press surfaces of 1 mm radius of curvature.

Cutting layer 12 is formed on top of the roughly processed die with a thickness of about 15 μm. By cutting precisely the cutting layer 12, a hollow-shaped die of 1 mm radius of curvature was obtained with high accuracy which was difficult to attain with a conventional grinding process. In addition, this method required only 1/10 of the time needed for a conventional grinding process.

Furthermore, the Pt-Ir alloy protective layer 11 is formed with a thickness of 3 μm by the sputtering method.

This embodiment uses a ternary alloy film as the cutting layer 12. In particular, it is possible to use Ni-P ternary alloys, for example, Ni-Si-P, Ni-Ti-P, Ni-Cu-P, Ni-Zr-P, Ni-Nb-P, Ni-Mo-P, Ni-Ru-P, Ni-Rh-P, Ni-Pd-P, Ni-Hf-P, Ni-Ta-P, Ni-W-P, Ni-Re-P, Ni-Os-P, and Ni-Ir-P.

It is also possible to use Co-P ternary alloys, for example, Co-Si-P, Co-Ti-P, Co-Cu-P, Co-Zr-P, Co-Nb-P, Co-Mo-P, Co-Ru-P, Co-Rh-P, Co-Pd-P, Co-Hf-P, Co-Ta-P, Co-W-P, Co-Re-P, Co-Os-P, and Co-Ir-P.

Furthermore, Fe-P ternary alloys can also be used, for example, Fe-Si-P, Fe-Ti-P, Fe-Cu-P, Fe-Zr-P, Fe-Nb-P, Fe-Mo-P, Fe-Ru-P, Fe-Rh-P, Fe-Pd-P, Fe-Hf-P, Fe-Ta-P, Fe-W-P, Fe-Re-P, Fe-Os-P, and Fe-Ir-P.

In practice, these alloy films can be used as cutting layer 12 when they have about 15 μm thickness.

For example, the following method is taken to form the above-mentioned alloy films as cutting layer 12 on the surface of a roughly processed die by a sputtering method.

First, a Ni-P or Co-P plated layer (percentage content of P=about 12 wt %) is formed with a thickness of about 0.5 mm by an electroless plating method on a Ni chip having a size of 10 mm×10 mm×1 mm. Thus, a Ni-P chip or a Co-P chip is formed.

In order to form a Ni-Si-P alloy film, 40 pieces of the Ni-P chip formed by the above-noted method are arranged equally on top of e.g. a Si disk target having a diameter of 6 inches. The sputtering method is conducted by using this as the target material to form the Ni-Si-P ternary alloy film.

In the same way, by arranging 40 pieces of the above-noted chip equally on top of disk targets of Si, Ti, Cu, Zr, Nb, Mo, Ru, Rh, Pd, Hf, Ta, W, Re, Os or Ir having a diameter of 6 inches and using them as the target materials for the sputtering process, different kinds of ternary alloy films can be formed according to each material of disk target being used.

In order to form a Fe-P ternary alloy film, Fe₃P compound chips having sizes of 10 mm×10 mm×1 mm are arranged equally on top of a disk target comprising a material selected from the various materials noted in this example above. In the same way, the sputtering method is conducted by using it as the target material to form different kinds of Fe-P ternary alloy film.

Figure 2:
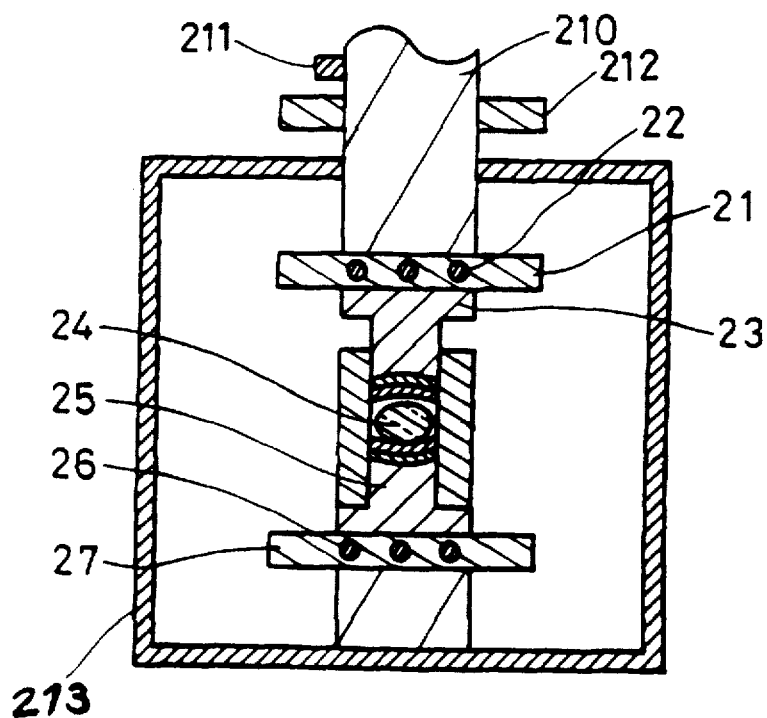
FIG. 2 is an outline view of a press-molding machine used in one embodiment of this invention.

In order to conduct the press-molding process by using the die of FIG. 1, this molding die is disposed in a press-molding machine shown in FIG. 2. Referring to FIG. 2, reference numeral 21 denotes a fixing block for an upper die; 22, a heater for the upper die; 23, the upper die; 24, a glass material; 25, a lower die; 26, a heater for the lower die; 27, a fixing block for the lower die; 210, a plunger; 211, a positioning sensor; 212, a stopper; 213, a cover.

Then, dense barium crown glass (SK-12) 24 manufactured by SUMITA OPTICAL GLASS, INC. which was processed into a spherical shape having a radius of 1 mm is placed on lower die 25, and upper die 23 is placed on the top. In this condition, the temperature was raised to 650° C., and the pressure was kept at about 40 kg/cm$^2$ in a nitrogen atmosphere for two minutes. After that, the temperature was lowered to 550° C. in this condition, and the pressure was then released. After it was cooled to room temperature, the molded glass lens was taken out, and the press-molding process of the glass optical element was completed.

After repeating this press-molding process 10,000 times, upper and lower dies 23, 25 were removed from the press-molding machine, and the condition of the pressed surfaces were observed with an optical microscope. At the same time, the surface roughness (root mean square (RMS) value, nm) of the pressed surface was measured, and the accuracy of each die was evaluated. The results are shown in Table 1 (a) and (b). In Table 1, "surface condition" refers to the observed results of the optical microscope. The units for surface roughness used in Table 1 are is all nm.

TABLE 1 (a)

Results of Press Experiment

| | | | After pressing 10,000 times | |
|---|---|---|---|---|
| Sample No. | Type of die | Surface roughness before pressing (RMS, nm) | Surface roughness (RMS, nm) | Surface condition |
| 2 | Ni—Si—P | 1.03 | 1.04 | satisfactory |
| 3 | Ni—Ti—P | 1.01 | 1.03 | satisfactory |
| 4 | Ni—Cu—P | 1.01 | 1.02 | satisfactory |
| 5 | Ni—Zr—P | 1.04 | 1.05 | satisfactory |
| 6 | Ni—Nb—P | 1.02 | 1.04 | satisfactory |
| 7 | Ni—Mo—P | 1.01 | 1.02 | satisfactory |
| 8 | Ni—Ru—P | 1.01 | 1.01 | satisfactory |
| 9 | Ni—Rh—P | 1.03 | 1.03 | satisfactory |
| 10 | Ni—Pd—P | 1.05 | 1.06 | satisfactory |
| 11 | Ni—Hf—P | 1.02 | 1.04 | satisfactory |
| 12 | Ni—Ta—P | 1.02 | 1.03 | satisfactory |
| 13 | Ni—W—P | 1.05 | 1.06 | satisfactory |
| 14 | Ni—Re—P | 1.02 | 1.03 | satisfactory |
| 15 | Ni—Os—P | 1.01 | 1.01 | satisfactory |
| 16 | Ni—Ir—P | 1.02 | 1.03 | satisfactory |
| 17 | Co—Si—P | 1.07 | 1.09 | satisfactory |
| 18 | Co—Ti—P | 1.05 | 1.08 | satisfactory |
| 19 | Co—Cu—P | 1.03 | 1.03 | satisfactory |
| 20 | Co—Zr—P | 1.07 | 1.09 | satisfactory |
| 21 | Co—Nb—P | 1.07 | 1.10 | satisfactory |
| 22 | Co—Mo—P | 1.06 | 1.09 | satisfactory |
| 23 | Co—Ru—P | 1.04 | 1.09 | satisfactory |
| 24 | Co—Rh—P | 1.07 | 1.08 | satisfactory |
| 25 | Co—Pd—P | 1.05 | 1.06 | satisfactory |
| 26 | Co—Hf—P | 1.04 | 1.06 | satisfactory |
| 27 | Co—Ta—P | 1.01 | 1.01 | satisfactory |
| 28 | Co—W—P | 1.04 | 1.05 | satisfactory |
| 29 | Co—Re—P | 1.06 | 1.09 | satisfactory |
| 30 | Co—Os—P | 1.09 | 1.11 | satisfactory |
| 31 | Co—Ir—P | 1.05 | 1.08 | satisfactory |

TABLE 1 (b)

Results of Press Experiment

| | | | After pressing 10,000 times | |
|---|---|---|---|---|
| Sample No. | Type of die | Surface roughness before pressing (RMS, nm) | Surface roughness (RMS, nm) | Surface condition |
| 32 | Fe—Si—P | 1.04 | 1.05 | satisfactory |
| 33 | Fe—Ti—P | 1.06 | 1.07 | satisfactory |
| 34 | Fe—Cu—P | 1.03 | 1.06 | satisfactory |
| 35 | Fe—Zr—P | 1.07 | 1.09 | satisfactory |
| 36 | Fe—Nb—P | 1.05 | 1.06 | satisfactory |
| 37 | Fe—Mo—P | 1.08 | 1.12 | satisfactory |
| 38 | Fe—Ru—P | 1.06 | 1.07 | satisfactory |
| 39 | Fe—Rh—P | 1.04 | 1.04 | satisfactory |
| 40 | Fe—Pd—P | 1.05 | 1.08 | satisfactory |
| 41 | Fe—Hf—P | 1.08 | 1.09 | satisfactory |
| 42 | Fe—Ta—P | 1.07 | 1.08 | satisfactory |
| 43 | Fe—W—P | 1.09 | 1.10 | satisfactory |
| 44 | Fe—Re—P | 1.04 | 1.09 | satisfactory |
| 45 | Fe—Os—P | 1.06 | 1.06 | satisfactory |
| 46 | Fe—Ir—P | 1.07 | 1.09 | satisfactory |

As shown in Table 1, the dies of this embodiment possess long durability which was not possible using conventional materials. This is one of the major characteristics of this invention.

A Ni-P binary alloy film was formed as the cutting layer on the base material of cemented carbide by the electroless plating method, and the Pt-Ir alloy film was used as a protective coat to form the die. This die was placed in the press-molding machine shown in FIG. 2. The press-molding process took place under the same conditions as above, and the accuracy of the die was evaluated. The results of this comparative experiment are shown in Table 2.

TABLE 2

Results of Comparative Experiment

| | | | After pressing 100 times | |
|---|---|---|---|---|
| Sample No. | Type of die | Surface roughness before pressing (RMS, nm) | Surface roughness (RMS, nm) | Surface condition |
| 1 | Ni—P plated film | 1.03 | 6.27 | Enlarged crack |

As shown as comparative Sample No. 1 in Table 2, the conventional molding die comprises a cutting layer of electroless Ni-P plated film cut into a transcriptional surface which is then coated with a Pt-Ir alloy film for protection. The glass does not adhere to this die, but the plated surface began to crack after being press-molded several times. After press-molding only 100 times, the crack on the plated surface enlarged more and more. The die did not stand any more use because the crack was transcribed on the lens, thereby deteriorating the quality of the lens.

This is due to the fact that Ni-P plated film which was used as the cutting layer did not have sufficient heat resistance so that Ni-P plated film can not withstand the heat cycle of the press-molding process when the glass having a high melting point is press-molded repeatedly.

On the other hand, according to the molding dies shown in invention Sample Nos. 2 to No. 46 of Table 1, the dies did not crack even after being press-molded 10,000 times, and the surface condition remained almost the same. In addition, the surface roughness had hardly changed. It shows that these dies can press-mold glass having a high melting point, such as SK-12.

The dies in this embodiment have enhanced the free-cutting property by including P in the film material of the cutting layer and improved the heat resistance by forming the cutting layer with materials of ternary alloy films. In this way, all the requirements which are necessary to press-mold the above-mentioned glass optical elements directly with high accuracy were met. It enabled press-molding a large quantity of glass optical elements having high melting points and shapes which was impossible using conventional methods.

In this embodiment, cemented carbide mainly consisting of WC was used as the base material of the press-molding die. It goes without saying that any other material can be used to attain the same results as long as the material has heat resistance and sufficient strength to withstand the press-molding process of optical glass. However, it is preferable to use cemented carbide mainly consisting of WC, cermet mainly consisting of TiN or TiC, or WC sintered compact.

As far as the protective layer is concerned, Pt-Ir was used in this embodiment, but the same results could be attained by using an alloy film of precious metal which includes at least one metal selected from the group consisting of Pt, Pd, Ir, Rh, Os, Ru, Re, W and Ta.

As a result, by press-molding glass by means of the press-molding die of this invention, it is possible to press-mold a large quantity of glass optical elements having high melting points and shapes which are difficult to attain by a grinding process.

EXAMPLE 2

The dimension and the structure of a die used in this embodiment are exactly the same as in the first embodiment except for the material used for the cutting layer and the protective layer. The same press-molding machine was used as in FIG.. 2.

The cutting layer used in this embodiment is a Ni-B ternary alloy, a Co-B ternary alloy, or a Fe-B ternary alloy.

In particular, it is possible to use Ni-B ternary alloys, for example, Ni-Si-B, Ni-Ti-B, Ni-Cu-B, Ni-Zr-B, Ni-Nb-B, Ni-Mo-B, Ni-Ru-B, Ni-Rh-B, Ni-Pd-B, Ni-Hf-B, Ni-Ta-B, Ni-W-B, Ni-Re-B, Ni-Os-B, and Ni-Ir-B.

It is also possible to use Co-B ternary alloys, for example, Co-Si-B, Co-Ti-B, Co-Cu-B, Co-Zr-B, Co-Nb-B, Co-Mo-B, Co-Ru-B, Co-Rh-B, Co-Pd-B, Co-Hf-B, Co-Ta-B, Co-W-B, Co-Re-B, Co-Os-B, and Co-Ir-B.

Furthermore, Fe-B ternary alloys can also be used, for example, Fe-Si-B, Fe-Ti-B, Fe-Cu-B, Fe-Zr-B, Fe-Nb-B, Fe-Mo-B, Fe-Ru-B, Fe-Rh-B, Fe-Pd-B, Fe-Hf-B, Fe-Ta-B, Fe-W-B, Fe-Re-B, Fe-Os-B, and Fe-Ir-B.

In practice, these alloys can be used to form cutting layers when they are processed with a thickness of about 15 μm by the sputtering method.

Furthermore, a Pt-Os alloy protective layer is formed with a thickness of 3 μm on the cutting layer by the sputtering method.

In order to form the cutting layer of ternary alloys on the base material of the molding die, the same procedure as in the first embodiment is used.

First, a Ni-B or Co-B plated layer (percentage content of B=about 12 wt %) is formed with a thickness of about 0.5 mm by an electroless plating method on a Ni chip having a size of 10 mm×10 mm×1 mm. Thus, a Ni-B chip or a Co-B chip is formed. Then, 40 pieces of these chips are arranged equally on top of disk targets of Si, Ti, Cu, Zr, Nb, Mo, Ru, Rh, Bd, Hf, Ta, W, Re, Os or Ir having a diameter of 6 inches. They are used as the target materials in the sputtering process.

In order to form a cutting layer of Fe-B ternary alloys, 40 pieces of FeB compound chips having sizes of 10 mm×10 mm×1 mm are arranged equally on top of disk targets consisting of the various materials mentioned above to form different kinds of ternary alloy films. Similarly, these alloy films were formed into transcription surfaces with high accuracy using a diamond tool.

Figure 3:
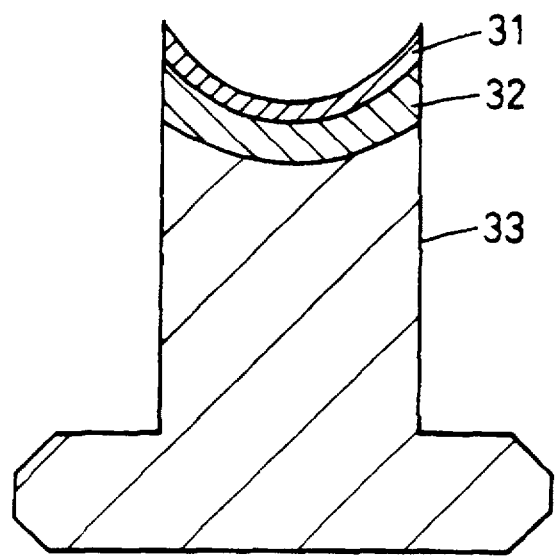
FIG. 3 is a cross-sectional view of one embodiment of this invention showing a die for press-molding glass optical elements.

A cross-sectional view of the die for press-molding glass optical elements produced by this method is shown in FIG. 3 where Ni-Ti-B alloy film is used as the cutting layer. Referring to FIG. 3, reference numeral 31 denotes a Pt-Os alloy protective layer covering the press surface; 32, a Ni-Ti-B alloy cutting layer; and 33, a base material of cemented carbide.

These dies are placed in the press-molding machine shown in FIG. 2. Then, dense barium crown glass (SK-12) which was processed into a spherical shape having a radius of 1 mm was molded under the same molding conditions as in the first example.

After repeating this press-molding process 10,000 times, upper and lower dies 23, 25 were removed from the press-molding machine and the condition of the pressed surfaces were observed with an optical microscope. And then, the surface roughness (RMS value, nm) of the pressed surface was measured, and the accuracy of each die was evaluated. The results are shown in Table 4 (a) and (b).

TABLE 4 (a)

Results of Press Experiment

| | | | After pressing 10,000 times | |
| --- | --- | --- | --- | --- |
| Sample No. | Type of die | Surface roughness before pressing (RMS, nm) | Surface roughness (RMS, nm) | Surface condition |
| 48 | Ni—Si—B | 1.05 | 1.07 | satisfactory |
| 49 | Ni—Ti—B | 1.04 | 1.05 | satisfactory |
| 50 | Ni—Cu—B | 1.04 | 1.05 | satisfactory |
| 51 | Ni—Zr—B | 1.04 | 1.05 | satisfactory |
| 52 | Ni—Nb—B | 1.02 | 1.04 | satisfactory |
| 53 | Ni—Mo—B | 1.06 | 1.07 | satisfactory |
| 54 | Ni—Ru—B | 1.01 | 1.03 | satisfactory |
| 55 | Ni—Rh—B | 1.05 | 1.06 | satisfactory |
| 56 | Ni—Pd—B | 1.06 | 1.07 | satisfactory |
| 57 | Ni—Hf—B | 1.03 | 1.04 | satisfactory |
| 58 | Ni—Ta—B | 1.02 | 1.03 | satisfactory |
| 59 | Ni—W—B | 1.02 | 1.03 | satisfactory |
| 60 | Ni—Re—B | 1.04 | 1.05 | satisfactory |
| 61 | Ni—Os—B | 1.06 | 1.07 | satisfactory |
| 62 | Ni—Ir—B | 1.04 | 1.05 | satisfactory |
| 63 | Co—Si—B | 1.01 | 1.02 | satisfactory |
| 64 | Co—Ti—B | 1.03 | 1.04 | satisfactory |
| 65 | Co—Cu—B | 1.02 | 1.03 | satisfactory |
| 66 | Co—Zr—B | 1.05 | 1.08 | satisfactory |
| 67 | Co—Nb—B | 1.01 | 1.13 | satisfactory |
| 68 | Co—Mo—B | 1.04 | 1.05 | satisfactory |
| 69 | Co—Ru—B | 1.02 | 1.03 | satisfactory |
| 70 | Co—Rh—B | 1.02 | 1.03 | satisfactory |
| 71 | Co—Pd—B | 1.02 | 1.04 | satisfactory |
| 72 | Co—Hf—B | 1.04 | 1.06 | satisfactory |
| 73 | Co—Ta—B | 1.05 | 1.06 | satisfactory |
| 74 | Co—W—B | 1.04 | 1.05 | satisfactory |
| 75 | Co—Re—B | 1.01 | 1.04 | satisfactory |
| 76 | Co—Os—B | 1.08 | 1.11 | satisfactory |
| 77 | Co—Ir—B | 1.06 | 1.08 | satisfactory |

TABLE 4 (b)

Results of Press Experiment

| Sample No. | Type of die | Surface roughness before pressing (RMS, nm) | After pressing 10,000 times | |
|---|---|---|---|---|
| | | | Surface roughness (RMS, nm) | Surface condition |
| 78 | Fe—Si—B | 1.05 | 1.06 | satisfactory |
| 79 | Fe—Ti—B | 1.04 | 1.05 | satisfactory |
| 80 | Fe—Cu—B | 1.03 | 1.04 | satisfactory |
| 81 | Fe—Zr—B | 1.04 | 1.05 | satisfactory |
| 82 | Fe—Nb—B | 1.05 | 1.06 | satisfactory |
| 83 | Fe—Mo—B | 1.03 | 1.03 | satisfactory |
| 84 | Fe—Ru—B | 1.02 | 1.03 | satisfactory |
| 85 | Fe—Rh—B | 1.04 | 1.06 | satisfactory |
| 86 | Fe—Pd—B | 1.06 | 1.08 | satisfactory |
| 87 | Fe—Hf—B | 1.07 | 1.08 | satisfactory |
| 88 | Fe—Ta—B | 1.02 | 1.04 | satisfactory |
| 89 | Fe—W—B | 1.05 | 1.06 | satisfactory |
| 90 | Fe—Re—B | 1.04 | 1.06 | satisfactory |
| 91 | Fe—Os—B | 1.06 | 1.06 | satisfactory |
| 92 | Fe—Ir—B | 1.07 | 1.09 | satisfactory |

Furthermore, a comparative experiment was conducted. A Ni-Binary alloy film was formed as the cutting layer on the base material of cemented carbide by the electroless plating method, and the Pt-Os alloy film as in this embodiment was used as a protective layer to form the die. The same press-molding process took place as in this embodiment, and the accuracy of the die was evaluated. The results of this comparative experiment are shown in Table 3.

TABLE 3

Results of Comparative Experiment

| Sample No. | Type of die | Surface roughness before pressing (RMS, nm) | After pressing 100 times | |
|---|---|---|---|---|
| | | | Surface roughness (RMS, nm) | Surface condition |
| 47 | Ni—B plated film | 1.03 | 6.84 | Enlarged crack |

As shown in comparative Sample No. 47, the die comprises binary alloy plated film of eletroless Ni-B as the cutting layer which is then coated with a Pt-Os alloy film. The glass does not adhere to this die, but the plated film began to crack after being press-molded several times. After press-molding 100 times, the crack on the plated surface enlarged. The die did not stand any more use because the crack was transcribed on the lens, thereby deteriorating the quality of the lens.

This is due to the fact that Ni-B binary alloy film which was used as the cutting layer did not have sufficient heat resistance to withstand the heat cycle of the press-molding process when the glass having a high melting point is press-molded repeatedly.

On the other hand, according to the dies of this invention shown in invention Sample Nos. 48 to No. 92, the dies did not crack even after press-molded 10,000 times and the surface condition remained almost the same.

In addition, the surface roughness had hardly changed. It shows that these dies can press-mold glass having a high melting point, such as SK-12.

As a result, by press-molding glass by means of the press-molding glass of this invention, it is possible to press-mold a large quantity of glass optical elements having high melting points and shapes which are difficult to attain by a grinding process.

As described above, the dies in this embodiment have enhanced the free-cutting property by including B in the cutting alloy layer and improved the heat resistance by forming ternary alloy films. In this way, all the requirements which are necessary to press-mold directly the above-mentioned glass optical elements with high accuracy were met. It enabled press-molding a large quantity of glass optical elements having high melting points and shapes which was impossible to be molded by conventional methods.

Cemented carbide mainly consisting of WC was used as the base material of the die for press-molding in this embodiment. It goes without saying that any other material can be used to attain the same results provided that it has heat resistance and sufficient strength to withstand the press-molding process for optical glass. However, it is preferable to use cemented carbide consisting mainly of WC, cermet mainly consisting of TiN or TiC, or WC sintered compact.

As far as the protective layer is concerned, Pt-Os was used in this embodiment, but the same results could be attained by using an alloy film of precious metal which includes at least one metal selected from the group consisting of Pt, Pd, Ir, Rh, Os, Ru, Re, W and Ta.

EXAMPLE 3

The die for press-molding of this embodiment is exactly the same as in the first embodiment except for the composition of material used for the alloy cutting layer and the protective layer.

The cutting layer used in this embodiment is a Cu binary alloy layer as the cutting layer. In particular, suitable Cu binary alloys include, for example, Cu-Ni, Cu-Co, Cu-Fe, Cu-Si, Cu-Ti, Cu-Zr, Cu-Nb, Cu-Mo, Cu-Ru, Cu-Rh, Cu-Pd, Cu-Hf, Cu-Ta, Cu-W, Cu-Re, and Cu-Os.

In order to form these binary alloy films, a Cu chip having a size of 10 mm×10 mm×1 mm is arranged equally on top of disk targets of Ni, Co, Fe, Si, Ti, Zr, Nb, Mo, Ru, Rh, Pd, Hf, Ta, W, Re or Os having a diameter of 6 inches. This is used as the target material for the sputtering process.

At the same time, by changing the number of the Cu-chip arranged on the disk targets, it is possible to control the composition of Cu binary alloys being formed.

A Pt-Rh alloy protective layer was formed with a thickness of 3 μm on the cutting layer by the sputtering method. The thickness of the cutting layer consisting of the Cu binary alloy was determined to be about 15 μm.

Figure 4:
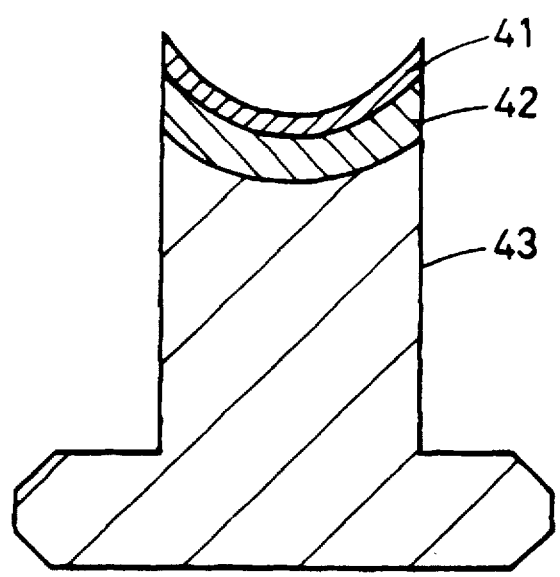
FIG. 4 is a cross-sectional view of one embodiment of this invention showing a die for press-molding glass optical elements.

A cross-sectional view of the die for press-molding in this embodiment is shown in FIG. 4. Referring to FIG. 4, reference numeral 41 denotes a Pt-Rh alloy protective layer covering the press surface; 42, a CU-Ti alloy cutting film; 43, a base material of cemented carbide.

These dies are placed in the press-molding machine shown in FIG. 2. Then, dense barium crown glass (SK-12) 24 which was processed into a spherical shape with a radius of 1 mm was press-molded under the same conditions as in the first embodiment.

After repeating this press-molding process 10,000 times, upper and lower dies 23, 25 were removed from the press-molding machine, and the condition of the pressed surfaces was observed with an optical microscope. At this moment, surface roughness (RMS value, nm) of the pressed surface was measured, and the accuracy of each die was evaluated.

The results are shown in Table 6 (a) and (b). The percentage content of Cu in the composition was controlled within the range of 20 to 80 at %. This is due to the fact that a diamond tool is worn when cut with a Cu content of less than 20 at %, while the shape is deformed when pressed with Cu content of more than 80 at % due to hardness deterioration.

As mentioned above, the percentage content of Cu was controlled by changing the number of the Cu-chip arranged on disk targets.

TABLE 6 (a)

Results of Press Experiment

| Sample No. | Type of die | Surface roughness before pressing (RMS, nm) | After pressing 10,000 times Surface roughness (RMS, nm) | Surface condition |
|---|---|---|---|---|
| 94 | Cu(20)—Ni(80) | 1.03 | 1.04 | satisfactory |
| 95 | Cu(50)—Ni(50) | 1.05 | 1.07 | satisfactory |
| 96 | Cu(80)—Ni(20) | 1.04 | 1.05 | satisfactory |
| 97 | Cu(20)—Co(80) | 1.07 | 1.08 | satisfactory |
| 98 | Cu(50)—Co(50) | 1.03 | 1.04 | satisfactory |
| 99 | Cu(80)—Co(20) | 1.04 | 1.05 | satisfactory |
| 100 | Cu(20)—Fe(80) | 1.06 | 1.07 | satisfactory |
| 101 | Cu(50)—Fe(50) | 1.03 | 1.05 | satisfactory |
| 102 | Cu(80)—Fe(20) | 1.02 | 1.03 | satisfactory |
| 103 | Cu(20)—Si(80) | 1.05 | 1.06 | satisfactory |
| 104 | Cu(50)—Si(50) | 1.04 | 1.05 | satisfactory |
| 105 | Cu(80)—Si(20) | 1.06 | 1.08 | satisfactory |
| 106 | Cu(20)—Ti(80) | 1.05 | 1.07 | satisfactory |
| 107 | Cu(50)—Ti(50) | 1.04 | 1.05 | satisfactory |
| 108 | Cu(80)—Ti(20) | 1.06 | 1.07 | satisfactory |
| 109 | Cu(20)—Zr(80) | 1.03 | 1.04 | satisfactory |
| 110 | Cu(50)—Zr(50) | 1.05 | 1.07 | satisfactory |
| 111 | Cu(80)—Zr(20) | 1.01 | 1.04 | satisfactory |
| 112 | Cu(20)—Nb(80) | 1.07 | 1.08 | satisfactory |
| 113 | Cu(50)—Nb(50) | 1.04 | 1.05 | satisfactory |
| 114 | Cu(80)—Nb(20) | 1.01 | 1.03 | satisfactory |
| 115 | Cu(20)—Mo(80) | 1.05 | 1.06 | satisfactory |

TABLE 6 (a)

Results of Press Experiment

| Sample No. | Type of die | Surface roughness before pressing (RMS, nm) | After pressing 10,000 times Surface roughness (RMS, nm) | Surface condition |
|---|---|---|---|---|
| 116 | Cu(50)—Mo(50) | 1.04 | 1.04 | satisfactory |
| 117 | Cu(80)—Mo(20) | 1.05 | 1.07 | satisfactory |
| 118 | Cu(20)—Ru(80) | 1.05 | 1.06 | satisfactory |
| 119 | Cu(50)—Ru(50) | 1.05 | 1.06 | satisfactory |
| 120 | Cu(80)—Ru(20) | 1.07 | 1.08 | satisfactory |
| 121 | Cu(20)—Rh(80) | 1.03 | 1.04 | satisfactory |
| 122 | Cu(50)—Rh(50) | 1.08 | 1.09 | satisfactory |
| 123 | Cu(80)—Rh(20) | 1.05 | 1.07 | satisfactory |
| 124 | Cu(20)—Pd(80) | 1.03 | 1.05 | satisfactory |
| 125 | Cu(50)—Pd(50) | 1.06 | 1.07 | satisfactory |
| 126 | Cu(80)—Pd(20) | 1.01 | 1.03 | satisfactory |
| 127 | Cu(20)—Hf(80) | 1.06 | 1.08 | satisfactory |
| 128 | Cu(50)—Hf(50) | 1.06 | 1.06 | satisfactory |
| 129 | Cu(80)—Hf(20) | 1.07 | 1.09 | satisfactory |
| 130 | Cu(20)—Ta(80) | 1.02 | 1.05 | satisfactory |
| 131 | Cu(50)—Ta(50) | 1.03 | 1.06 | satisfactory |
| 132 | Cu(80)—Ta(20) | 1.04 | 1.05 | satisfactory |
| 133 | Cu(20)—W(80) | 1.02 | 1.04 | satisfactory |
| 134 | Cu(50)—W(50) | 1.06 | 1.07 | satisfactory |
| 135 | Cu(80)—W(20) | 1.05 | 1.08 | satisfactory |
| 136 | Cu(20)—Re(80) | 1.01 | 1.03 | satisfactory |
| 137 | Cu(50)—Re(50) | 1.04 | 1.06 | satisfactory |
| 138 | Cu(80)—Re(20) | 1.05 | 1.05 | satisfactory |

TABLE 6 (a)-continued

Results of Press Experiment

| Sample No. | Type of die | Surface roughness before pressing (RMS, nm) | After pressing 10,000 times Surface roughness (RMS, nm) | Surface condition |
|---|---|---|---|---|
| 139 | Cu(20)—Os(80) | 1.07 | 1.08 | satisfactory |
| 140 | Cu(50)—Os(50) | 1.01 | 1.03 | satisfactory |
| 141 | Cu(80)—Os(20) | 1.05 | 1.07 | satisfactory |

Furthermore, a comparative experiment was conducted. As in the first embodiment, a Ni-P film was formed as the cutting layer on the base material of cemented carbide by the electroless plating method, and the Pt-Rh alloy film was used as a protective layer to form the die. The press-molding process took place repeatedly under exactly the same molding conditions. The results of this experiment are shown in Table 5.

TABLE 5

Results of Comparative Experiment

| Sample No. | Type of die | Surface roughness before pressing (RMS, nm) | After pressing 100 times Surface roughness (RMS, nm) | Surface condition |
|---|---|---|---|---|
| 93 | Ni—P plated film | 1.03 | 7.19 | Enlarged crack |

When the die used in comparative sample No. 93 was molded, the glass did not adhere to the die, but the plated layer began to crack after being press-molded several times. After press-molding 100 times, the crack on the plated surface enlarged. The die did not stand any more use because the crack was transcribed on the lens, thereby deteriorating the quality of the lens.

This is due to the fact that Ni-P plated film which was used as the cutting layer did not have sufficient heat resistance to withstand the heat cycle of the press-molding process when the glass having a high melting point is press-molded repeatedly.

On the other hand, according to the dies of this invention shown in Sample Nos. 94 to No. 141, the dies did not crack even after being press-molded 10,000 times, and the surface condition remained almost the same. The surface roughness has hardly changed. It shows that these dies can press-mold glass having a high melting point, such as SK-12.

As a result, by press-molding glass by means of the press-molding glass of this invention, it is possible to press-mold a large quantity of glass optical elements having high melting points and shapes which are difficult to attain by a grinding process.

Accordingly, all the requirements which are necessary to directly press-mold the above-mentioned glass optical elements with high accuracy were met. It enabled press-molding a large quantity of glass optical elements having high melting points and shapes which was impossible using conventional methods.

Cemented carbide consisting mainly of WC was used as the base material of the die for press-molding in this embodiment. It goes without saying that any other material can be used to attain the same results as long as it has heat resistance and sufficient strength to withstand the press-molding process of optical glass. However, it is preferable to use cemented carbide consisting mainly of WC, cermet consisting mainly of TiN or TiC, or WC sintered compact.

As far as the protective layer is concerned, Pt-Rh was used in this embodiment, but the same results could be attained by using an alloy film of precious metal which includes at least one metal selected from the group consisting of Pt, Pd, Ir, Rh, Os, Ru, Re, W and Ta.

EXAMPLE 4

The die for press-molding in this embodiment is exactly the same as in the first embodiment except for the composition of material used for the alloy cutting layer and the protective layer.

The cutting layer used in this embodiment is a Si binary alloy layer. In particular, it is possible to use Si binary alloys for the cutting layer, for example, Si-Ni, Si-Co, Si-Fe, Si-Cu, Si-Ti, Si-Zr, Si-Nb, Si-Mo, Si-Ru, Si-Rh, Si-Pd, Si-Hf, Si-Ta, Si-W, Si-Re, and Si-Os.

In order to form these binary alloy films, a Si chip having a size of 10 mm×10 mm×1 mm is arranged equally on disk targets of Ni, Co, Fe, Si, Ti, Zr, Nb, Mo, Ru, Rh, Pd, Hf, Ta, W, Re or Os having a diameter of 6 inches. This is used as the target material in the sputtering process.

By changing the number of the Si chip arranged on the disk targets, it is possible to control the composition of Si binary alloys being formed.

A Pt-Rh alloy protective layer was formed with a thickness of 3 μm on the cutting layer by the sputtering method. The thickness of the cutting layer consisting of Si binary alloys was determined to be about 15 μm.

Figure 5:
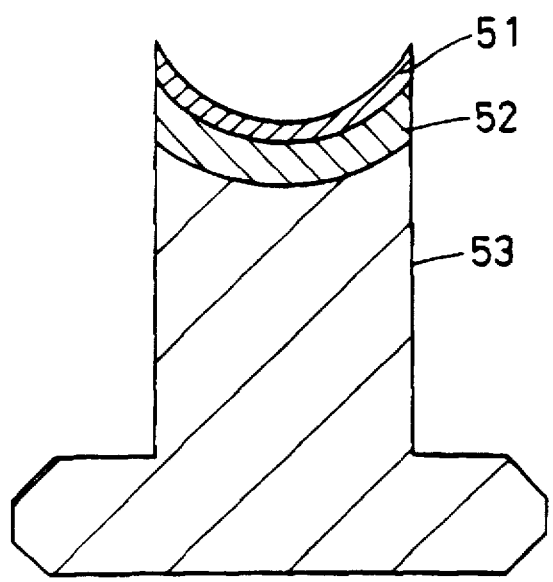
FIG. 5 is a cross-sectional view of one embodiment of this invention showing a die for press-molding glass optical elements.

A cross-sectional view of the die for press-molding in this embodiment is shown in FIG. 5. Referring to FIG. 5, reference numeral 51 denotes a Pt-Pd alloy protective layer covering the press surface; 52, a Si-Ta alloy cutting film; 53, a base material of cemented carbide.

These dies are placed in the press-molding machine shown in FIG. 2. Then, dense barium crown glass (SK-12) 24 which was processed into a spherical shape with a radius of 1 mm was press-molded under the same conditions as in the first embodiment.

After repeating this press-molding process 10,000 times, upper and lower dies 23, 25 were removed from the press-molding machine and the condition of the pressed surfaces was observed with an optical microscope. At the same time, the surface roughness (RMS value, nm) of the pressed surface was measured, and the accuracy of each die was evaluated.

The results are shown in Table 8 (a) to (b). The percentage content of Si in the composition was controlled within the range of 20 to 80 at %. This is due to the fact that a diamond tool is worn when cut with a Si content of less than 20 at %, while the shape is deformed when pressed with a Si content of more than 80 at % due to hardness deterioration.

As described above, the percentage content of Si in the cutting layer was changed by controlling the number of the Si chips arranged on the disk targets.

TABLE 8 (a)

Results of Press Experiment

| Sample No. | Type of die | Surface roughness before pressing (RMS, nm) | After pressing 10,000 times Surface roughness (RMS, nm) | Surface condition |
|---|---|---|---|---|
| 143 | Si(20)—Ni(80) | 1.03 | 1.04 | satisfactory |
| 144 | Si(50)—Ni(50) | 1.05 | 1.07 | satisfactory |
| 145 | Si(80)—Ni(20) | 1.04 | 1.05 | satisfactory |
| 146 | Si(20)—Co(80) | 1.07 | 1.08 | satisfactory |
| 147 | Si(50)—Co(50) | 1.03 | 1.04 | satisfactory |
| 148 | Si(80)—Co(20) | 1.04 | 1.05 | satisfactory |
| 149 | Si(20)—Fe(80) | 1.06 | 1.07 | satisfactory |
| 150 | Si(50)—Fe(50) | 1.03 | 1.05 | satisfactory |
| 151 | Si(80)—Fe(20) | 1.02 | 1.03 | satisfactory |
| 152 | Si(20)—Cu(80) | 1.05 | 1.06 | satisfactory |
| 153 | Si(50)—Cu(50) | 1.03 | 1.05 | satisfactory |
| 154 | Si(80)—Cu(20) | 1.05 | 1.07 | satisfactory |
| 155 | Si(20)—Ti(80) | 1.08 | 1.09 | satisfactory |
| 156 | Si(50)—Ti(50) | 1.06 | 1.08 | satisfactory |
| 157 | Si(80)—Ti(20) | 1.03 | 1.06 | satisfactory |
| 158 | Si(20)—Zr(80) | 1.03 | 1.04 | satisfactory |
| 159 | Si(50)—Zr(50) | 1.04 | 1.07 | satisfactory |
| 160 | Si(80)—Zr(20) | 1.02 | 1.06 | satisfactory |
| 161 | Si(20)—Nb(80) | 1.07 | 1.08 | satisfactory |
| 162 | Si(50)—Nb(50) | 1.06 | 1.08 | satisfactory |
| 163 | Si(80)—Nb(20) | 1.04 | 1.07 | satisfactory |

TABLE 8 (b)

Results of Press Experiment

| Sample No. | Type of die | Surface roughness before pressing (RMS, nm) | After pressing 10,000 times Surface roughness (RMS, nm) | Surface condition |
|---|---|---|---|---|
| 164 | Si(20)—Mo(80) | 1.02 | 1.05 | satisfactory |
| 165 | Si(50)—Mo(50) | 1.07 | 1.08 | satisfactory |
| 166 | Si(80)—Mo(20) | 1.05 | 1.08 | satisfactory |
| 167 | Si(20)—Ru(80) | 1.04 | 1.05 | satisfactory |
| 168 | Si(50)—Ru(50) | 1.01 | 1.03 | satisfactory |
| 169 | Si(80)—Ru(20) | 1.04 | 1.06 | satisfactory |
| 170 | Si(20)—Rh(80) | 1.05 | 1.07 | satisfactory |
| 171 | Si(50)—Rh(50) | 1.04 | 1.06 | satisfactory |
| 172 | Si(80)—Rh(20) | 1.03 | 1.05 | satisfactory |
| 173 | Si(20)—Pd(80) | 1.04 | 1.07 | satisfactory |
| 174 | Si(50)—Pd(50) | 1.03 | 1.05 | satisfactory |
| 175 | Si(80)—Pd(20) | 1.03 | 1.06 | satisfactory |
| 176 | Si(20)—Hf(80) | 1.04 | 1.05 | satisfactory |
| 178 | Si(50)—Hf(50) | 1.06 | 1.07 | satisfactory |
| 179 | Si(80)—Hf(20) | 1.05 | 1.08 | satisfactory |
| 180 | Si(20)—Ta(80) | 1.04 | 1.07 | satisfactory |
| 181 | Si(50)—Ta(50) | 1.04 | 1.06 | satisfactory |
| 182 | Si(80)—Ta(20) | 1.04 | 1.05 | satisfactory |
| 183 | Si(20)—W(80) | 1.02 | 1.04 | satisfactory |
| 184 | Si(50)—W(50) | 1.06 | 1.07 | satisfactory |
| 185 | Si(80)—W(20) | 1.05 | 1.08 | satisfactory |
| 186 | Si(20)—Re(80) | 1.01 | 1.03 | satisfactory |
| 187 | Si(50)—Re(50) | 1.04 | 1.06 | satisfactory |
| 188 | Si(80)—Re(20) | 1.05 | 1.05 | satisfactory |

Furthermore, a comparative experiment was conducted. As in the first embodiment, a Ni-P plated film was formed as the cutting layer on the base material of cemented carbide by the electroless plating method, and the Pt-Pd alloy film was used as a protective layer to form the die. The press-molding process took place repeatedly under exactly the same press-molding conditions. The results of this experiment are shown in Table 7.

TABLE 7

Results of Comparative Experiment

| Sample No. | Type of die | Surface roughness before pressing (RMS, nm) | After pressing 100 times | |
|---|---|---|---|---|
| | | | Surface roughness (RMS, nm) | Surface condition |
| 142 | Ni—P plated film | 1.03 | 5.96 | Enlarged crack |

When the die used in comparative Sample No. 142 was molded, the glass did not adhere to this die, but the plated layer began to crach after press-molded several times. After press-molding 100 times, the crack on the plated surface enlarged. The die did not stand any more use because the crack was transcribed on the lens, thereby deteriorating the quality of the lens.

This is due to the fact that Ni-P plated film which was used as the cutting layer has not sufficient heat resistance to withstand the heat cycle of the press-molding process when the glass having a high melting point is press-molded repeatedly.

On the other hand, according to the dies of this invention shown in Sample Nos. 143 to No. 191, the dies did not crack even after press-molded 10,000 times and the surface condition remained almost the same. The surface roughness has hardly changed. It shows that these dies can press-mold glass having a high melting point, such as SK-12.

As a result, by press-molding glass by means of the press-molding glass of this invention, it is possible to press-mold a large quantity of glass optical elements having high melting points and shapes which are difficult to attain by a grinding process.

Accordingly, all the requirements which are necessary to directly press-mold the above-mentioned glass optical elements with high accuracy were met. It enabled to press-mold a large quantity of glass optical elements having high melting points and shapes which were impossible to be molded in the past.

Cemented carbide consisting mainly of WC was used as the base material of the die for press-molding in this embodiment. It goes without saying that any other material can be used to attain the same results that has heat resistance and sufficient strength to withstand the press-molding process of optical glass. However, it is preferable to use cemented carbide consisting mainly of WC, cermet mainly consisting of TiN or TiC, or WC sintered compact.

EXAMPLE 5

The dimension and the structure of the die used in this embodiment are exactly the same as in the first embodiment except for the material used for the cutting layer and the protective layer. The same press-molding machine was used as in FIG. 2.

In this embodiment, an amorphous binary alloy layer is used as the cutting layer consisting of Ni, Co, Cr, Ta, Mo, Ti, W, Nb, V or Cu.

As for an amorphous binary alloy layer with Ni, suitable Ni alloys include, for example, Ni-Co, Ni-Cr, Ni-Ta, Ni-Mo, Ni-Ti, Ni-W, Ni-Nb, Ni-V, Ni-Cu, and Ni-Al.

As for an amorphous binary alloy layer with Co, suitable Co alloys include, for example, Co-Cr, Co-Ta, Co-Mo, Co-Ti, Co-W, Co-Nb, Co-V, Co-Cu, and Co-Al.

As for an amorphous binary alloy layer with Cr, suitable Cr alloys include, for example, Cr-Ta, Cr-Mo, Cr-Ti, Cr-M, Cr-Nb, Cr-V, Cr-Cu, and Cr-Al.

As for an amorphous binary alloy layer with Ta, suitable Ta alloys include, for example, Ta-Mo, Ta-Ti, Ta-W, Ta-Nb, Ta-V, Ta-Cu, and Ta-Al.

As for an amorphous binary alloy layer with Mo, suitable Mo alloys include, for example, Mo-Ti, Mo-W, Mo-Nb, Mo-V, Mo-Cu, and Mo-Al.

As for an amorphous binary alloy layer with Ti, suitable Ti alloys include, for example, Ti-W, Ti-Nb, Ti-V, Ti-Cu, and Ti-Al.

As for an amorphous binary alloy layer with W, suitable W alloys include, for example, W-Nb, W-V, W-Cu, and W-Al.

As for an amorphous binary alloy layer with Nb, suitable Nb alloys include, for example, Nb-V, Nb-Cu, and Nb-Al.

As for an amorphous binary alloy layer with V, suitable V alloys include, for example, V-Cu and V-Al.

As for an amorphous binary alloy layer with Cu, suitable Cu alloys include, for example, Cu-Al alloy film.

The reason for putting the cutting layer in an amorphous condition is that a grain boundary will not be present in the cutting layer in this condition. As a result, the cutting property of the cutting layer improves considerably, and the cutting tools will not be worn so much, thereby conducting the cutting process with high accuracy.

In this embodiment, the above-mentioned amorphous alloy film was cut with use of a diamond tool forming into an extremely accurate surface.

By cutting the amorphous alloy film in this way, a hollow-shaped die of 1 mm radius of curvature was obtained with high accuracy which was difficult to attain with a conventional grinding process. In addition, this method required only 1/10 of the time needed for the conventional grinding process.

In practice, these amorphous alloys can be used to form cutting layers of molding dies when they are processed with a thickness of about 15 μm by the sputtering method.

Furthermore, a Pt-Ru alloy protective layer was formed with a thickness of 3 μm on the cutting layer by the sputtering method in this embodiment.

Figure 6:
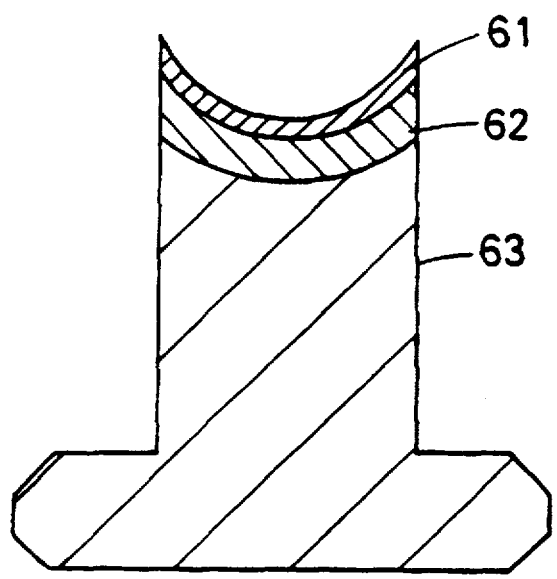
FIG. 6 is a cross-sectional view of one embodiment of this invention showing a die for press-molding glass optical elements.

A cross-sectional view of a die for press-molding produced in this way is shown in FIG. 6 in which a Cr-Cu alloy film is used for the cutting layer. Referring to FIG. 6, reference numeral 61 denotes a Pt-Ru alloy protective layer covering the press surface; 62, a Cr-Cu alloy cutting film; 63, a base material of cemented carbide.

These dies are placed in the press-molding machine shown in FIG. 2. Then, dense barium crown glass (SK-12) 24 which was processed into a spherical shape with a radius of 1 mm was molded under the same conditions as in all the above-mentioned embodiments.

After repeating this press-molding process 10,000 times, upper and lower dies 23, 25 were removed from the press-molding machine, and the condition of the pressed surfaces was observed with an optical microscope. At this moment, the surface roughness (RMS value, nm) of the pressed surface was measured, and the accuracy of each die was evaluated. The results are shown in Table 10 (a), (b) and (c).

TABLE 10 (a)

Results of Press Experiment

| Sample No. | Type of die | Surface roughness before pressing (RMS, nm) | After pressing 10,000 times Surface roughness (RMS, nm) | Surface condition |
|---|---|---|---|---|
| 193 | Ni—Co | 1.06 | 1.07 | satisfactory |
| 194 | Ni—Cr | 1.04 | 1.08 | satisfactory |
| 195 | Ni—Ta | 1.09 | 1.13 | satisfactory |
| 196 | Ni—Mo | 1.07 | 1.09 | satisfactory |
| 197 | Ni—Ti | 1.03 | 1.05 | satisfactory |
| 198 | Ni—W | 1.04 | 1.08 | satisfactory |
| 199 | Ni—Nb | 1.08 | 1.09 | satisfactory |
| 200 | Ni—V | 1.08 | 1.12 | satisfactory |
| 201 | Ni—Cu | 1.03 | 1.07 | satisfactory |
| 202 | Ni—Al | 1.04 | 1.06 | satisfactory |
| 203 | Co—Cr | 1.08 | 1.10 | satisfactory |
| 204 | Co—Ta | 1.05 | 1.09 | satisfactory |
| 205 | Co—Mo | 1.04 | 1.06 | satisfactory |
| 206 | Co—Ti | 1.03 | 1.06 | satisfactory |
| 207 | Co—W | 1.02 | 1.07 | satisfactory |
| 208 | Co—Nb | 1.01 | 1.05 | satisfactory |
| 209 | Co—V | 1.06 | 1.08 | satisfactory |
| 210 | Co—Cu | 1.06 | 1.09 | satisfactory |
| 211 | Co—Al | 1.04 | 1.06 | satisfactory |
| 212 | Cr—Ta | 1.03 | 1.06 | satisfactory |
| 213 | Cr—Mo | 1.04 | 1.08 | satisfactory |

TABLE 10 (b)

Results of Press Experiment

| Sample No. | Type of die | Surface roughness before pressing (RMS, nm) | After pressing 10,000 times Surface roughness (RMS, nm) | Surface condition |
|---|---|---|---|---|
| 214 | Cr—Ti | 1.02 | 1.06 | satisfactory |
| 215 | Cr—W | 1.04 | 1.05 | satisfactory |
| 216 | Cr—Nb | 1.03 | 1.07 | satisfactory |
| 217 | Cr—V | 1.06 | 1.08 | satisfactory |
| 218 | Cr—Cu | 1.06 | 1.06 | satisfactory |
| 219 | Cr—Al | 1.04 | 1.05 | satisfactory |
| 220 | Ta—Mo | 1.06 | 1.08 | satisfactory |
| 221 | Ta—Ti | 1.05 | 1.08 | satisfactory |
| 222 | Ta—W | 1.05 | 1.06 | satisfactory |
| 223 | Ta—Nb | 1.04 | 1.09 | satisfactory |
| 224 | Ta—V | 1.05 | 1.07 | satisfactory |
| 225 | Ta—Cu | 1.02 | 1.06 | satisfactory |
| 226 | Ta—Al | 1.05 | 1.08 | satisfactory |
| 227 | Mo—Ti | 1.04 | 1.07 | satisfactory |
| 228 | Mo—W | 1.03 | 1.04 | satisfactory |
| 229 | Mo—Nb | 1.04 | 1.09 | satisfactory |
| 230 | Mo—V | 1.09 | 1.15 | satisfactory |
| 231 | Mo—Cu | 1.06 | 1.08 | satisfactory |
| 232 | Mo—Al | 1.05 | 1.08 | satisfactory |
| 233 | Ti—W | 1.01 | 1.06 | satisfactory |
| 234 | Ti—Nb | 1.07 | 1.08 | satisfactory |
| 235 | Ti—V | 1.07 | 1.09 | satisfactory |
| 236 | Ti—Cu | 1.01 | 1.05 | satisfactory |
| 237 | Ti—Al | 1.06 | 1.10 | satisfactory |
| 238 | W—Nb | 1.07 | 1.09 | satisfactory |
| 239 | W—V | 1.07 | 1.08 | satisfactory |
| 240 | W—Cu | 1.04 | 1.09 | satisfactory |
| 241 | W—Al | 1.04 | 1.07 | satisfactory |
| 242 | Nb—V | 1.02 | 1.06 | satisfactory |
| 243 | Nb—Cu | 1.06 | 1.08 | satisfactory |

TABLE 10 (c)

Results of Press Experiment

| Sample No. | Type of die | Surface roughness before pressing (RMS, nm) | After pressing 10,000 times Surface roughness (RMS, nm) | Surface condition |
|---|---|---|---|---|
| 244 | Nb—Al | 1.04 | 1.07 | satisfactory |
| 245 | V—Cu | 1.04 | 1.06 | satisfactory |
| 246 | V—Al | 1.05 | 1.08 | satisfactory |
| 247 | Cu—Al | 1.08 | 1.12 | satisfactory |

Furthermore, a comparative experiment was conducted in crystalline films consisting of Ni-Co, Ni-Cr, Ni-Ta, Ni-Mo, Ni-W, Ni-Nb, Ni-V, Ni-Cu, Ni-Al, Co-Cr, Co-Ta, Co-Mo, Co-W, Co-Nb, Co-V, Co-Cu, Co-Al, Cr-Ta, Cr-Mo, Cr-Tl, Cr-W, Cr-V, Cr-Cu, Cr-Al, Ta-Mo, Ta-Ti, Ta-W, Ta-Nb, Ta-V, Ta-Al, Mo-Ti, Mo-W, Mo-Nb, Mo-V, Mo-Cu, Mo-Al, Ti-W, Ti-Nb, Ti-Cu, Ti-Al, W-Nb, W-V, W-Cu, W-Al, Nb-V, Nb-Cu, Nb-Al, V-Cu, V-Al, and Cu-Al were formed on the base material of cemented carbide to conduct the cutting process. However, due to the strong cutting force and attrition of tools, it was not possible to form the desired shape.

Therefore, a Ni-P plated film was formed as the cutting layer on the base material of cemented carbide by the electroless plating method and Pt-Ru alloy film was used as the protective layer for the die as in the first embodiment. The same press-molding process was performed repeatedly, and the accuracy of each die was evaluated. The results are shown in Table 9.

TABLE 9

Results of Comparative Experiment

| Sample No. | Type of die | Surface roughness before pressing (RMS, nm) | After pressing 100 times Surface roughness (RMS, nm) | Surface condition |
|---|---|---|---|---|
| 192 | Ni—P plated film | 1.04 | 8.41 | Enlarged crack |

When the die used in comparative Sample No. 192 was press-molded, the glass did not adhere to this die, but the plated layer began to crack after being press-molded several times. After press-molding 100 times, the crack on the plated surface enlarged. The die did not stand any more use because the crack was transcribed on the lens, thereby deteriorating the quality of the lens.

This is due to the fact that Ni-P plated film which was used as the cutting layer did not have sufficient heat resistance to withstand the heat cycle of the press-molding process when the glass having a high melting point is press-molded repeatedly.

On the other hand, according to the dies of this invention shown in Sample Nos. 193 to No. 247, the dies did not crack even after press-molded 10,000 times and the surface condition remained almost the same. The surface roughness has hardly changed. It shows that these dies can press-mold glass having a high melting point, such as SK-12.

As a result, by press-molding glass by means of the press-molding glass of this invention, it is possible to press-mold a large quantity of glass optical elements having high melting points and shapes which are difficult to attain by a grinding process.

Accordingly, all the requirements which are necessary to press-mold the above-mentioned glass optical elements directly with high accuracy were met. It enabled press-molding a large quantity of glass optical elements having high melting points and shapes which was impossible using conventional methods.

Cemented carbide consisting mainly of WC was used as the base material of the die for press-molding in this embodiment. It goes without saying that any other material can be used to attain the same results provided that it has heat resistance and sufficient strength to withstand the press-molding process of optical glass. However, it is preferable to use cemented carbide consisting mainly of WC, cermet consisting mainly of TiN or TiC, or WC sintered compact.

As far as the protective layer is concerned, Pt-Pd was used in this embodiment, but the same results could be attained by using an alloy film of precious metal which includes at least one metal selected from the group consisting of Pt, Pd, Ir, Rh, Os, Ru, Re, W and Ta.

EXAMPLE 6

A die for press-molding in this embodiment has an intermediate layer on the surface on which an alloy cutting layer and a protective layer are formed.

The dimensions of the die are the same as in the first embodiment.

These cutting layers are applicable when they are formed with a thickness of 15 μm by the sputtering method.

The alloy cutting layer can be cut into a surface with extreme accuracy with use of a diamond tool. By cutting the alloy film in this way, a hollow-shaped die of 1 mm radius of curvature could be obtained with extreme accuracy which was difficult to attain in a conventional grinding process. In addition, this method required only 1/10 of the time needed for the conventional grinding process.

A Pt-Ta alloy protective layer was formed with a thickness of 3 μm on the cutting layer by the sputtering method.

Figure 7:
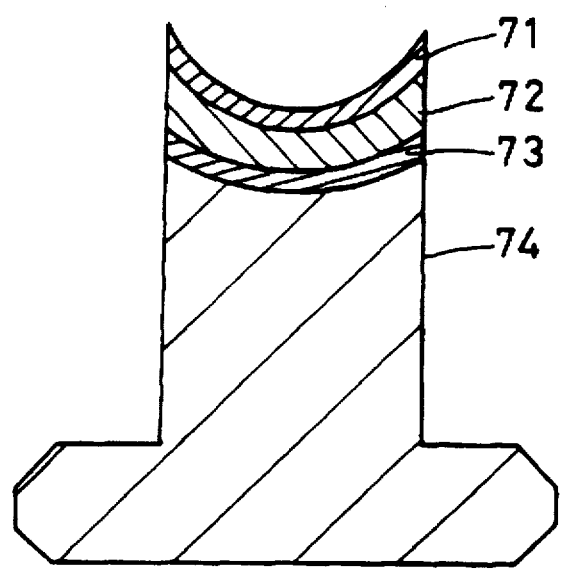
FIG. 7 is a cross-sectional view of one embodiment of this invention showing a press-molding die for glass optical elements.

A cross-sectional view of a die for press-molding produced in this way is shown in FIG. 7 in which a SiC film is used for the intermediate layer and a Cu-Ti alloy film for the cutting layer. Referring to FIG. 7, reference numeral 71 denotes a Pt-Ta alloy protective layer covering the press surface; 72, a Cu-Ti alloy cutting film; 73, a SiC film; and 74, a base material of cemented carbide.

This die was used to press-mold dense barium crown glass (SK-12) 24 which was processed into a spherical shape having a radius of 1 mm under the same conditions as in the first embodiment.

After repeating this press-molding process 10,000 times, 30,000 times, and 50,000 times, upper and lower dies 23, 25 were removed from the press-molding machine, and the condition of the pressed surfaces was observed with an optical microscope. At the same time, the surface roughness (RMS value, nm) of the pressed surface was measured, and the accuracy of each die was evaluated. The results are shown in Table 12.

TABLE 12

Results of Press Experiment

| Sample No. | Type of die | inter-mediate layer | Surface roughness before pressing (RMS, nm) | Surface condition after pressing 10,000 times (RMS, nm) | 30,000 times (RMS, nm) | 50,000 times (RMS, nm) |
|---|---|---|---|---|---|---|
| 254 | Ni—W—P | Ni | 1.05 | 1.07 | 1.08 | 1.09 |
| 255 | Ni—W—P | SiC | 1.06 | 1.06 | 1.08 | 1.08 |
| 256 | Ni—W—P | TiN | 1.03 | 1.04 | 1.04 | 1.05 |
| 257 | Ni—W—P | Ta2O5 | 1.06 | 1.07 | 1.09 | 1.01 |
| 258 | Ni—Cu—B | Ni | 1.04 | 1.06 | 1.08 | 1.09 |
| 259 | Ni—Cu—B | SiC | 1.04 | 1.05 | 1.06 | 1.07 |
| 260 | Ni—Cu—B | TiN | 1.02 | 1.03 | 1.05 | 1.08 |
| 261 | Ni—Cu—B | Ta2O5 | 1.04 | 1.04 | 1.07 | 1.08 |
| 262 | Cu—Ti | Ni | 1.04 | 1.05 | 1.07 | 1.09 |
| 263 | Cu—Ti | SiC | 1.04 | 1.06 | 1.07 | 1.08 |
| 264 | Cu—Ti | TiN | 1.03 | 1.03 | 1.06 | 1.07 |
| 265 | Cu—Ti | Ta2O5 | 1.03 | 1.04 | 1.06 | 1.06 |
| 266 | Si—Zr | Ni | 1.04 | 1.05 | 1.07 | 1.10 |
| 267 | Si—Zr | SiC | 1.06 | 1.07 | 1.08 | 1.09 |
| 268 | Si—Zr | TiN | 1.05 | 1.05 | 1.06 | 1.08 |
| 269 | Si—Zr | Ta2O5 | 1.05 | 1.06 | 1.08 | 1.09 |
| 270 | Ni—Mo | Ni | 1.04 | 1.05 | 1.07 | 1.08 |
| 271 | Ni—Mo | SiC | 1.04 | 1.05 | 1.07 | 1.09 |
| 272 | Ni—Mo | TiN | 1.03 | 1.03 | 1.05 | 1.07 |
| 273 | Ni—Mo | Ta2O5 | 1.04 | 1.05 | 1.06 | 1.07 |

In this embodiment, it is possible to use, for example, films of Ni, SiC, Tin, and Ta$_2$O$_5$. In practice, an intermediate layer can be used when it is formed with a thickness of about 1 μm by the sputtering method and so forth.

As for the cutting layer, it is possible to use, for example, alloy films of Ni-W-P, Ni-Cu-B, Cu-Ti, Si-Zr and amorphous alloy films of Ni-Mo.

As a comparative experiment, a Ni-P plated film was formed as the cutting layer on a base material of cemented carbide by the electroless plating method, and Pt-Ta alloy film was used as a protective layer to form the die. The same press-molding process took place, and the accuracy of each die was evaluated. The results are shown in Table 11.

TABLE 11

Results of Comparative Experiment

| Sample No. | Type of die | Surface roughness before pressing (RMS, nm) | After pressing 100 times | |
|---|---|---|---|---|
| | | | Surface roughness (RMS, nm) | Surface condition |
| 248 | Ni—P plated film | 1.07 | 5.49 | Transcribed crack |

When the molding die of comparative Sample No. 248 was molded, the glass did not adhere to this die, but the plated layer began to crach after press-molded several times. After press-molding 100 times, the crack on the plated surface enlarged. The die did not stand any more use because the crack was transcribed on the lens, thereby deteriorating the quality of the lens.

Furthermore, the die in this embodiment has characteristics superior to the dies shown in the embodiments 1 to 5, as shown in the following.

As the cutting layers in the embodiments 1 to 5 (i.e., Example 1 to 5), alloy films of Ni-W-P, Ni-Cu-B, Cu-Ti, Si-Zr, and Ni-Mo amorphous alloy films were formed using Pt-Ta alloy film as a protective layer. After press-molding these dies 10,000 times, 30,000 times and 40,000 times, the condition of the pressed surfaces was observed with an optical microscope. At the same time, the surface roughness (RMS value, nm) of the pressed surfaces were measured, and the accuracy of each die was evaluated. The results are shown in Table 13.

TABLE 13

Results of Comparative Experiment

| Sample No. | Type of die | Surface roughness before pressing (RMS,nm) | Surface condition after pressing | | |
|---|---|---|---|---|---|
| | | | 10,000 times (RMS,nm) | 30,000 times (RMS,nm) | 40,000 times (RMS,nm) |
| 249 | Ni—W—P | 1.04 | 1.13 | 2.06 | Peeled |
| 250 | Ni—Cu—B | 1.02 | 1.09 | 1.87 | Peeled |
| 251 | Cu—Ti | 1.05 | 1.12 | 2.07 | Peeled |
| 252 | Si—Zr | 1.02 | 1.08 | 1.94 | Peeled |
| 253 | Ni—Mo | 1.04 | 1.10 | 2.01 | Peeled |

In the Sample Nos. 249 to 253, the molding dies did not have rough surfaces,. and the films did not peel or crack even after press-molded 30,000 times repeatedly. This shows the superior characteristics compared to the conventional dies. However, the films peeled off from the base material when press-molded 40,000 times so that the process had to be stopped then.

On the other hand, the dies in the Sample Nos. 254 to 273 of this embodiment did not crack even after being press-molded 50,000 times repeatedly. The surface condition remained almost the same. The surface roughness hardly changed. This shows that these dies can press-mold glass having a high melting point, such as SK-12. Accordingly, by press-molding glass by means of the dies for press-molding of this invention, it is possible to press-mold a large quantity of glass optical elements having high melting points and shapes which was difficult to attain by a grinding process.

As a result, all the requirements which are necessary to directly press-mold the above-mentioned glass optical elements with high accuracy were met. It enabled press-molding a large quantity of the glass optical elements having high melting points and shapes which was impossible prior to this invention.

Cemented carbide consisting mainly of WC was used as the base material of the die for press-molding in this embodiment. It goes without saying that any other material can be used to attain the same results that has heat resistance and sufficient strength to withstand the press-molding process of optical glass. However, it is preferable to use cemented carbide mainly consisting of WC, cermet mainly consisting of TiN or TiC, or WC sintered compact.

As for the intermediate layer, alloy films of Ni-W-P, Ni-Cu-B, Cu-Ti, SiZr, and Ni-Mo amorphous alloy film were used with cutting layers of Ni, SiC, TiN, and $Ta_2O_5$. It goes without saying that the same results can be obtained by using the alloy films shown in the embodiments 1 to 5 with cutting layers consisting of other metal, carbide, nitrogen, and oxide.

As far as the protective layer is concerned, Pt-Ir was used in this embodiment, but the same results could be attained by using an alloy film of precious metal which includes at least one metal selected from the group consisting of Pt, Pd, Ir, Rh, Os, Ru, Re, W and Ta.

Furthermore, this embodiment referred to the manufacturing process of a hollow-shaped die with 1 mm radius of curvature. Shapes which are difficult to attain with conventional grinding methods, such as dies for non-axisymmetric lenses or microprism arrays, can also be processed with this method.

What is claimed is:

1. A method of press-molding glass optical elements, comprising press-molding glass, having a high melting point, at a temperature of 650° C. and higher using a die for press-molding glass optical elements comprising:
    (a) a base material having heat resistance and sufficient strength to withstand press-molding of optical glass elements;
    (b) at least one film on said base material comprising, an alloy film containing P and one metal selected from the group consisting of Ni, Co, and Fe, and one metal selected from the group consisting of Si, Ti, Cu, Zr, Nb, Mo, Ru, Rh, Pd, Hf, Ta, W, Re, Os, and Ir, to form a cutting layer; and
    (c) a surface protective layer on top of said cutting layer made of an alloy film comprising at least one metal selected from the group consisting of Pt, Pd, Ir, Rh, Os, Ru, Re, W, and Ta.

2. A method of press-molding glass optical elements as claimed in claim 1, wherein said die for press-molding glass optical elements further comprises an intermediate layer comprising at least one film having a material selected from the group consisting of metal, carbide, nitride and oxide between said base material and said cutting layer.

3. A method of press-molding glass optical elements, comprising press-molding glass, having a high melting point, at a temperature of 650° C. and higher using a die for press-molding glass optical elements comprising:
    (a) a base material having heat resistance and sufficient strength to withstand press-molding of optical glass elements;
    (b) at least one film on said base material comprising an alloy film containing Cu and 20 to 80 atom % of one metal selected from the group consisting of Ni, Co, Fe, Si, Ti, Zr, Nb, Mo, Ru, Rh, Pd, Hf, Ta, W, Re, Os, and Ir, to form a cutting layer; and (c) a surface protective layer on top of said cutting layer made of an alloy film comprising at least one metal selected from the group consisting of Pt, Pd, Ir, Rh, Os, Ru, Re, W, and Ta.

4. A method of press-molding glass optical elements as claimed in claim 3, wherein said die for press-molding glass optical elements further comprises an intermediate layer comprising at least one film having a material selected from the group consisting of metal carbide, nitride and oxide between said base material and said cutting layer.

5. A method of press-molding glass optical elements, comprising press-molding glass, having a high melting point, at a temperature of 650° C. and higher using a die for press-molding glass optical elements comprising:

(a) a base material having heat resistance and sufficient strength to withstand press-molding of optical glass elements;

(b) at least one film on said base material comprising an alloy film containing Si and 20 to 80 atom % of one metal selected from the group consisting of Ni, Co, Fe, Cu, Ti, Zr, Nb, Mo, Ru, Rh, Pd, Hf, Ta, W, Re, Os, and Ir, to form a cutting layer; and (c) a surface protective layer on top of said cutting layer made of an alloy film comprising at least one metal selected from the group consisting of Pt, Pd, Ir, Rh, Os, Ru, Re, W, and Ta.

6. A method of press-molding glass optical elements as claimed in claim 5, wherein said die for press-molding glass optical elements further comprises an intermediate layer comprising at least one film having a material selected from the group consisting of metal, carbide, nitride and oxide between said base material and said cutting layer.

* * * * *